US012794421B2

(12) United States Patent
Ho

(10) Patent No.: US 12,794,421 B2
(45) Date of Patent: Nov. 10, 2026

(54) AMPLIFY DEVICE AND SEMICONDUCTOR DEVICE

(71) Applicant: RichWave Technology Corp., Taipei (TW)

(72) Inventor: Po-Yen Ho, Taipei (TW)

(73) Assignee: RichWave Technology Corp., Taipei (TW)

( * ) Notice: Subject to any disclaimer, the term of this patent is extended or adjusted under 35 U.S.C. 154(b) by 431 days.

(21) Appl. No.: 18/539,131

(22) Filed: Dec. 13, 2023

(65) Prior Publication Data

US 2025/0105804 A1 Mar. 27, 2025

(30) Foreign Application Priority Data

Sep. 21, 2023 (TW) ................................ 112136140

(51) Int. Cl.

| | |
|---|---|
| ***H03F 3/213*** | (2006.01) |
| ***H10W 72/90*** | (2026.01) |
| *H10W 72/00* | (2026.01) |
| *H10W 72/50* | (2026.01) |

(Continued)

(52) U.S. Cl.

CPC ........... *H03F 3/213* (2013.01); *H10W 72/90* (2026.01); *H03F 2200/451* (2013.01); *H10W 72/07552* (2026.01); *H10W 72/07553* (2026.01); *H10W 72/527* (2026.01); *H10W 72/537* (2026.01); *H10W 72/59* (2026.01); *H10W 90/753* (2026.01)

(58) Field of Classification Search

CPC .. H03F 3/213; H03F 2200/451; H10W 72/90; H10W 90/753; H10W 72/527; H10W 72/07552; H10W 72/07553; H10W 72/537; H10W 72/59

USPC .......................................................... 330/307

See application file for complete search history.

(56) References Cited

U.S. PATENT DOCUMENTS

| | | | | |
|---|---|---|---|---|
| 11,108,362 | B2 | 8/2021 | Maalouf et al. | |
| 12,176,856 | B2 * | 12/2024 | Komatsuzaki | H03F 1/0288 |
| 12,362,709 | B2 * | 7/2025 | Hellberg | H03F 3/195 |

(Continued)

FOREIGN PATENT DOCUMENTS

| | | | |
|---|---|---|---|
| CN | 111641391 | 9/2020 | |
| CN | 111641391 B * | 8/2023 | H03F 1/26 |

(Continued)

OTHER PUBLICATIONS

Alessandro Parisi et al., "A Ka-Band Doherty Power Amplifier in a 150 nm GaN-on-SiC Technology for 5G Applications", Electronics, Aug. 29, 2023, pp. 1-11.

(Continued)

*Primary Examiner* — Hafizur Rahman
(74) *Attorney, Agent, or Firm* — JCIPRNET

(57) ABSTRACT

An amplify device and a semiconductor device are provided in the disclosure. The amplify device includes an amplify unit, a radio frequency signal combination circuit, a first conductive wire and a second conductive wire. The first conductive wire is coupled between an output end of the amplify unit and a first input end of the radio frequency signal combination circuit. The second conductive wire is coupled between the output end of the amplify unit and a second input end of the radio frequency signal combination circuit. Wherein, a length of the first conductive wire is different from a length of the second conductive wire.

18 Claims, 4 Drawing Sheets

(51) Int. Cl.
*H10W 72/59* (2026.01)
*H10W 90/00* (2026.01)

(56) References Cited

U.S. PATENT DOCUMENTS

| | | | | |
|---|---|---|---|---|
| 2009/0179702 | A1* | 7/2009 | Blednov | H03F 3/195 330/277 |
| 2016/0126902 | A1* | 5/2016 | Hellberg | H03F 1/565 330/295 |
| 2018/0152148 | A1* | 5/2018 | Wong | H03F 1/0288 |
| 2018/0159479 | A1* | 6/2018 | Wu | H03F 1/0288 |
| 2018/0234058 | A1 | 8/2018 | Noori et al. | |
| 2019/0260109 | A1* | 8/2019 | Gu | H01Q 1/2283 |
| 2020/0052661 | A1* | 2/2020 | Noori | H03F 1/0288 |
| 2020/0203294 | A1* | 6/2020 | Wu | H10W 44/20 |
| 2021/0126596 | A1* | 4/2021 | Wong | H03F 3/195 |
| 2021/0366868 | A1 | 11/2021 | Gill et al. | |
| 2023/0291358 | A1 | 9/2023 | Hashinaga | |

FOREIGN PATENT DOCUMENTS

| | | | | |
|---|---|---|---|---|
| CN | 113765482 B | * | 10/2023 | H03F 1/0288 |
| CN | 115051656 B | * | 3/2025 | H03F 3/193 |

OTHER PUBLICATIONS

"Office Action of Taiwan Counterpart Application", issued on Jul. 17, 2024, p. 1-p. 6.

* cited by examiner

AMPLIFY DEVICE AND SEMICONDUCTOR DEVICE

CROSS-REFERENCE TO RELATED APPLICATION

This application claims the priority benefit of Taiwan application serial no. 112136140, filed on Sep. 21, 2023. The entirety of the above-mentioned patent application is hereby incorporated by reference herein and made a part of this specification.

BACKGROUND

Technical Field

The disclosure relates to an amplify device and a semiconductor device, and in particular relates to an amplify device and a semiconductor device for wideband application.

Description of Related Art

In the related circuits of radio frequency signal processing, an amplify unit may be used to amplify and process the signal, which is then output to the radio frequency circuit or antenna for transmission and reception. Regarding the matching part of the output end of the amplify unit, the conventional technology usually uses a single conductive wire to connect the amplify unit and the subsequent circuit. Under such circumstances, when the amplify device is used in wideband applications, it is more difficult to achieve wideband characteristics.

SUMMARY

An amplify device and a semiconductor device, which may complete the matching operation of the amplify unit in wideband applications, are provided in the disclosure.

The amplify device of the disclosure includes an amplify unit, a radio frequency signal combination circuit, a first conductive wire, and a second conductive wire. The amplify unit has an input end and an output end. The radio frequency signal combination circuit has a first input end, a second input end, and an output end. The first conductive wire is coupled between the output end of the amplify unit and the first input end of the radio frequency signal combination circuit. The second conductive wire is coupled between the output end of the amplify unit and the second input end of the radio frequency signal combination circuit. A length of the first conductive wire is different from a length of the second conductive wire.

A semiconductor device of the disclosure includes a first chip, a second chip, a first conductive wire, and a second conductive wire. The first chip has an amplify unit, in which the amplify unit has an input end and an output end. The second chip has a radio frequency signal combination circuit. The radio frequency signal combination circuit has a first input end, a second input end, and an output end. The first input end of the radio frequency signal combination circuit is coupled to the second input end of the radio frequency signal combination circuit. The first conductive wire has a first end coupled to the output end of the amplify unit, and a second end of the first conductive wire is coupled to the first input end of the radio frequency signal combination circuit. The second conductive wire has a first end coupled to the output end of the amplify unit, and a second end of the second conductive wire is coupled to the second input end of the radio frequency signal combination circuit. A length of the first conductive wire is different from a length of the second conductive wire.

Based on the above, in the amplify device of the disclosure, the output end of the amplify unit is connected to the first input end of the radio frequency signal combination circuit through the first conductive wire, and the output end of the amplify unit is connected to the second input end of the radio frequency signal combination circuit through the second conductive wire. By making the lengths of the first and second conductive wires different, a wideband application characteristic may be achieved in the matching operation of the amplify unit. This effectively enhances the performance of the amplify device.

DETAILED DESCRIPTION OF DISCLOSED EMBODIMENTS

Figure 1:
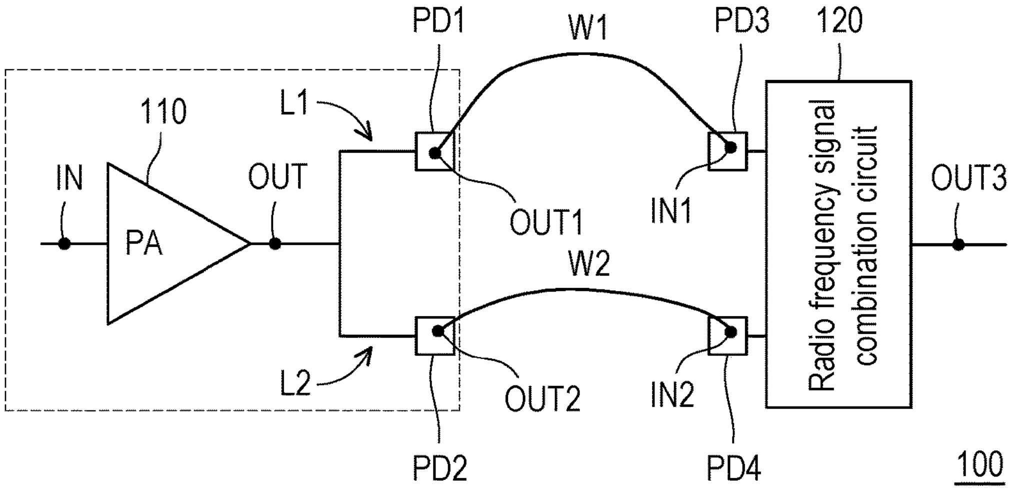
FIG. 1 is a schematic diagram of an amplify device of an embodiment of the disclosure.

Referring to FIG. 1, FIG. 1 is a schematic diagram of an amplify device of an embodiment of the disclosure. The amplify device 100 includes an amplify unit 110, a radio frequency signal combination circuit 120, a first conductive wire W1 and a second conductive wire W2. The amplify unit 110 has an input end IN and an output end OUT. The radio frequency signal combination circuit 120 has a first input end IN1, a second input end IN2, and an output end OUT3. The first conductive wire W1 is coupled between the output end OUT of the amplify unit 110 and the first input end IN1 of the radio frequency signal combination circuit 120. The second conductive wire W2 is coupled between the output end OUT of the amplify unit 110 and the second input end IN2 of the radio frequency signal combination circuit 120. The first conductive wire W1 and the second conductive wire W2 may be arranged in parallel. In addition, in this embodiment, the length of the first conductive wire W1 is different from the length of the second conductive wire W2. The wire diameter of the first conductive wire W1 and the wire diameter of the second conductive wire W2 may be the same. In an embodiment, the amplify unit 110 may be a power amplifier PA. The input end IN of the amplify unit 110 is configured to receive the radio frequency signal, and the output end OUT of the amplify unit 110 is configured to output the amplified radio frequency signal.

In this embodiment, by respectively disposing the first conductive wire W1 and the second conductive wire W2 with different lengths between the output end OUT of the amplify unit 110 and the first input end IN1 and the second input end IN2 of the radio frequency signal combination circuit 120, corresponding to different radio frequency signal frequencies, different impedance values may be provided between the output end OUT of the amplify unit 110 and the first input end IN1 and the second input end IN2 of the radio frequency signal combination circuit 120. In this way, by providing better matching for the amplify unit 110, wideband characteristics may be effectively achieved.

In addition, in terms of implementation details, the output end OUT of the amplify unit 110 may be coupled to the pad PD1 through a trace L1 and coupled to the pad PD2 through another trace L2. The pad PD1 has an output end OUT1, and the pad PD2 has an output end OUT2. In addition, the first input end IN1 and the second input end IN2 of the radio frequency signal combination circuit 120 may be respectively located on the pads PD3 and PD4. Furthermore, the first conductive wire W1 and the second conductive wire W2 may both be bonding wires, the first end of the first conductive wire W1 is connected to the output end OUT1 on the pad PD1, and the second end of the first conductive wire W1 is connected to the first input end IN1 of the radio frequency signal combination circuit 120 (located on the pad PD3). The first end of the second conductive wire W2 is connected to the output end OUT2 on the pad PD2, and the second end of the second conductive wire W2 is connected to the second input end IN2 of the radio frequency signal combination circuit 120 (located on the pad PD4). The pads may be solder pads.

In the amplify unit 110, the trace length of the trace L1 may be equal to the trace length of the trace L2. Alternatively, in other embodiments of the disclosure, the length of the trace L1 may be different from the length of the trace L2. However, it is worth noting that in the embodiment of the disclosure, the sum of the length of the trace L1 and the length of the first conductive wire W1 needs to be greater than the sum of the length of the trace L2 and the length of the second conductive wire W2. For example, the input end IN of the amplify unit 110 may be configured to input a radio frequency signal ranging from a first frequency f1 to a second frequency f2; at the first frequency f1, the trace L1 and the first conductive wire W1 may provide a first impedance corresponding to the frequency f1; at the second frequency f2, the trace L2 and the second conductive wire W2 may provide a second impedance corresponding to the frequency f2, and the first frequency f1 is greater than the second frequency f2. It is worth noting that in this embodiment, the length of the first conductive wire W1 and the second conductive wire W2 may be adjusted during the wiring operation by controlling the height of the first conductive wire W1 and the second conductive wire W2. Taking the length of the first conductive wire W1 being greater than the length of the second conductive wire W2 as an example, during the wiring operation, the arc height of the arc-shaped first conductive wire W1 may be greater than the arc height of the arc-shaped second conductive wire W2.

In this embodiment, taking the length of the first conductive wire W1 being greater than the length of the second conductive wire W2 as an example, the length of the first conductive wire W1 may be about 35 mils, and the length of the second conductive wire W2 may be about 23 mils. In this embodiment of the disclosure, the length of the first conductive wire W1 may be, for example, N times the length of the second conductive wire. In order to provide a better matching inductance value in a wideband, N may be between 1.4 and 1.7. Of course, the lengths of the first conductive wire W1 and the second conductive wire W2 may be set according to the actual application conditions of the amplify device 100. The above data are only examples for illustration and are not subject to any specific limitations.

In a comparative example, the sum of the length of the trace L1 and the length of the first conductive wire W1 is equal to the sum of the length of the trace L2 and the length of the second conductive wire W2. Under the same EVM specification of −40 dB, compared with the comparative example, the output power of this embodiment may be increased from 17~19 dBm to 18.3~20.3 dBm, hence providing superior operational efficiency.

Figure 2:
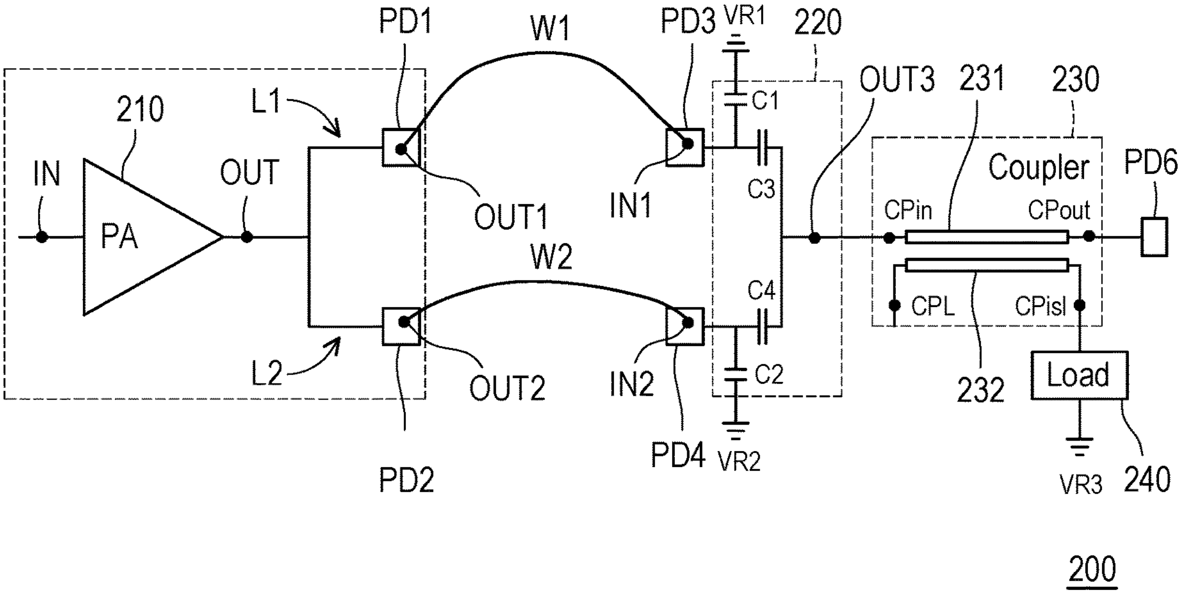
FIG. 2 is a schematic diagram of an amplify device of another embodiment of the disclosure.

Referring to FIG. 2 below, FIG. 2 is a schematic diagram of an amplify device of another embodiment of the disclosure. The amplify device 200 includes an amplify unit 210, a radio frequency signal combination circuit 220, a first conductive wire W1, and a second conductive wire W2. The amplify device 200 may also selectively include a coupler 230.

Similar to FIG. 1, the amplify unit 210 may be a power amplifier PA and has an input end IN and an output end OUT. The output end OUT of the amplify unit 210 is coupled to the pad PD1 through the trace L1, and is coupled to the pad PD2 through the trace L2. The pads PD1 and PD2 respectively have output ends OUT1 and OUT2. The trace L1 has a first trace length, and the trace L2 has a second trace length. The radio frequency signal combination circuit 220 has a first input end IN1 and a second input end IN2. The first input end IN1 and the second input end IN2 are respectively located on the pads PD3 and PD4. The radio frequency signal combination circuit 220 further has an output end OUT3, which is coupled to the pad PD6. The first conductive wire W1 is formed between the output end OUT1 on the pad PD1 and the first input end IN1 of the radio frequency signal combination circuit 220. The second conductive wire W2 is formed between the output end OUT2 on the pad PD2 and the second input end IN2 of the radio frequency signal combination circuit 220. The first conductive wire W1 and the second conductive wire W2 may both be bonding wires, may have the same wire diameter, and may have different lengths.

It is worth mentioning, in the amplify unit 210, the trace length of the trace L1 may be equal to the trace length of the trace L2. Alternatively, in other embodiments of the disclosure, the length of the trace L1 may be different from the length of the trace L2. However, it is worth noting that in the embodiment of the disclosure, the sum of the length of the trace L1 and the length of the first conductive wire W1 needs to be greater than the sum of the length of the trace L2 and the length of the second conductive wire W2. For example, the input end IN of the amplify unit 110 may be configured to input a radio frequency signal ranging from a first frequency f1 to a second frequency f2; at the first frequency f1, the trace L1 and the first conductive wire W1 may provide a first impedance matching the frequency f1; at the second frequency f2, the trace L2 and the second conductive wire W2 may provide a second impedance matching the frequency f2, and the first frequency f1 is greater than the second frequency f2.

Compared with FIG. 1, in this embodiment, the radio frequency signal combination circuit 220 further includes capacitors C1 to C4. The capacitor C1 is coupled between the first input end IN1 of the radio frequency signal combination circuit 220 and the reference voltage end VR1. The capacitor C2 is coupled between the second input end IN2 of the radio frequency signal combination circuit 220 and the reference voltage end VR2. The capacitor C3 is coupled between the first input end IN1 of the radio frequency signal combination circuit 220 and the output end OUT3 of the radio frequency signal combination circuit 220. The capacitor C4 is coupled between the second input end IN2 of the radio frequency signal combination circuit 220 and the output end OUT3 of the radio frequency signal combination circuit 220. The capacitors C3 and C4 are configured as DC signal isolation capacitors. In this embodiment, the capacitors C1 and C2 may have the same capacitance value.

Incidentally, the reference voltage ends VR1 to VR3 may be three independent ends to respectively receive the same reference voltage. The reference voltage ends VR1 to VR3 may also be two of them coupled to each other, and the other one of them may be an independent end. Alternatively, the reference voltage ends VR1 to VR3 may also be the same end. The reference voltage ends may be ground ends.

In this embodiment, the first conductive wire W1 and the capacitor C1 may form a first impedance matching the first frequency f1. The second conductive wire W2 and the capacitor C2 may form a second impedance matching the second frequency f2. The first frequency f1 is greater than the second frequency f2.

In addition, the amplify device 200 may further include a coupler 230 coupled between the output end OUT3 of the radio frequency signal combination circuit 220 and the pad PD6. The coupler 230 may have an input end CPin, an output end CPout, a coupling end CPL, and an isolation end CPisl. The output end OUT3 of the radio frequency signal combination circuit 220 is coupled to the input end CPin of the coupler 230. The coupler 230 includes coupling elements 231 and 232. The coupling element 231 is coupled between the input end CPin and the output end CPout, and the coupling element 232 is coupled between the coupling end CPL and the isolation end CPisl. The isolation end CPisl is coupled to the reference voltage end VR3 through a load 240. In this embodiment, the output end CPout of the coupler 230 may be coupled to the pad PD6, and may be coupled to other electronic elements through the pad PD6.

In this embodiment, the amplify unit 210, the frequency signal combination circuit 220, and the coupler 230 may be disposed on the same chip or on multiple chips respectively, without any fixed limitation.

Figure 3:
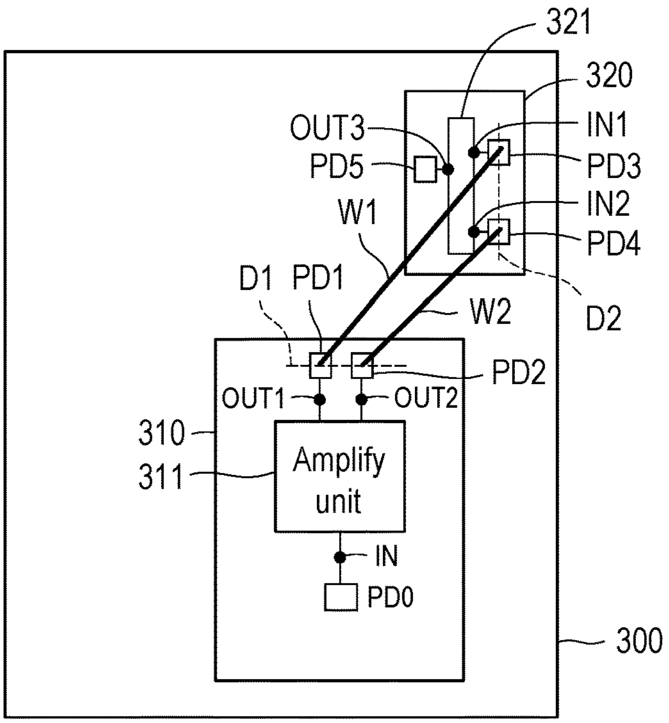
FIG. 3 is a top schematic diagram of a semiconductor device of an embodiment of the disclosure.

Referring to FIG. 3, FIG. 3 is a top schematic diagram of a semiconductor device of an embodiment of the disclosure. The semiconductor device 300 includes a first chip 310 and a second chip 320. The first chip 310 has an amplify unit 311 and a plurality of pads PD0 to PD2. The output end of the amplify unit 311 may be coupled to the output ends OUT1 and OUT2 (as shown in FIG. 1 and FIG. 2), and coupled to the pads PD1 and PD2 respectively through the output ends OUT1 and OUT2. The input end IN of the amplify unit 311 may be coupled to the pad PD0.

The second chip 320 has a radio frequency signal combination circuit 321 and multiple pads PD3 to PD5. The radio frequency signal combination circuit 321 has a first input end IN1 and a second input end IN2 respectively coupled to the pads PD3 and PD4. The first input end IN1 of the radio frequency signal combination circuit is coupled to the second input end IN2 of the radio frequency signal combination circuit, for example, through the internal trace of the second chip 320 or through the external conductive wire of the second chip 320. The output end OUT3 of the radio frequency signal combination circuit 321 is coupled to the pad PD5.

The pads PD1 and PD2 of the first chip 310 may be disposed along the straight line D1, while the pads PD3 and PD4 of the second chip 320 may be disposed along the straight line D2. In this embodiment, the straight line D1 and the straight line D2 may be perpendicular to each other, or have a non-zero included angle that is greater than a threshold.

In this embodiment, the first conductive wire W1 is a bonding wire and is coupled between the pads PD1 and PD3. The second conductive wire W2 is also a bonding wire and is coupled between the pads PD2 and PD4. The linear distance between the pads PD1 and PD3 is greater than the linear distance between the pads PD2 and PD4. In such a state, the length of the first conductive wire W1 may be greater than the length of the second conductive wire W2.

Figure 4:
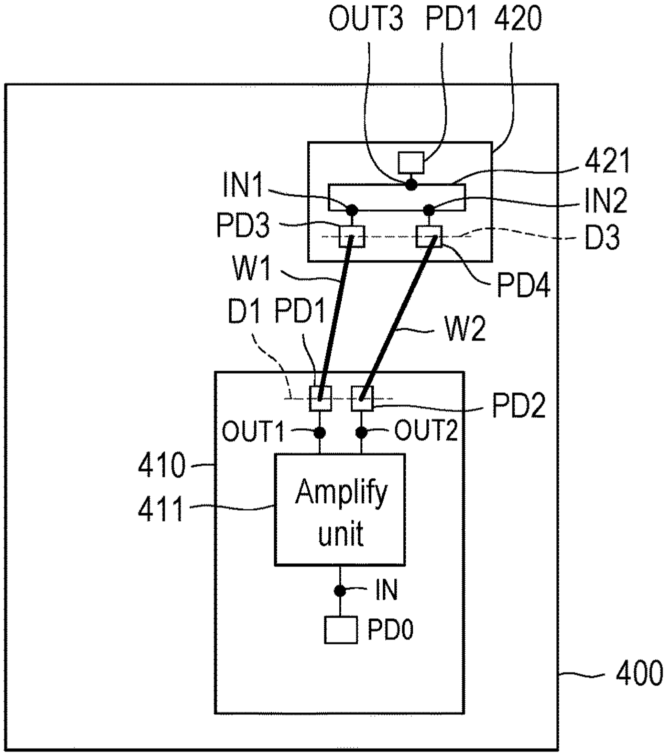
FIG. 4 is a top schematic diagram of a semiconductor device of an embodiment of the disclosure.

Referring to FIG. 4, FIG. 4 is a top schematic diagram of a semiconductor device of an embodiment of the disclosure. The semiconductor device 400 includes a first chip 410 and a second chip 420. The first chip 410 has an amplify unit 411 and multiple pads PD0 to PD2. The second chip 420 has a radio frequency signal combination circuit 421 and multiple pads PD3 to PD5.

Similar to the embodiment of FIG. 3, the first conductive wire W1 and the second conductive wire W2 are both bonding wires. The first conductive wire W1 is coupled between the pads PD1 and PD3, and the second conductive wire W2 is coupled between the pads PD2 and PD4. Different from the embodiment of FIG. 3, in this embodiment, the pads PD1 and PD2 of the first chip 410 may be disposed along the straight line D1, while the pads PD3 and PD4 of the second chip 420 may be disposed along the straight line D3. In this embodiment, the straight line D1 and the straight line D3 are parallel to each other, or have a non-zero included angle that is smaller than the above threshold.

In this embodiment, the linear distance between the pads PD1 and PD3 is close to the linear distance between the pads PD2 and PD4. In such a state, by raising the arc height of the first conductive wire W1, the length of the first conductive wire W1 may be greater than the length of the second conductive wire W2.

Figure 5:
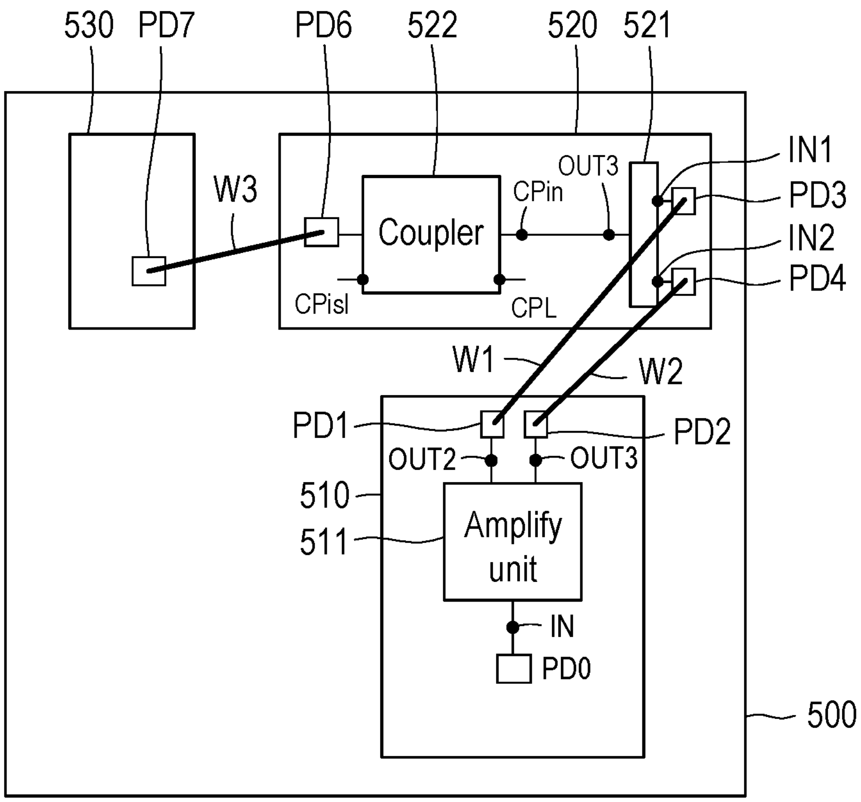
FIG. 5 is a top schematic diagram of a semiconductor device of an embodiment of the disclosure.

Referring to FIG. 5, FIG. 5 is a top schematic diagram of a semiconductor device of an embodiment of the disclosure. The semiconductor device 500 includes a first chip 510, a second chip 520, and a third chip 530. The first chip 510 has an amplify unit 511 and multiple pads PD0 to PD2. The second chip 520 has a radio frequency signal combination circuit 521, a coupler 522, and multiple pads PD3 to PD6. The third chip 530 may have a pad PD7.

The coupling relationship between the amplify unit 511 and the radio frequency signal combination circuit 521 on the first chip 510 and the second chip 520 is similar to the embodiment of FIG. 3 and not repeated herein. In this embodiment, the second chip 520 further includes a coupler 522. The input end CPin of the coupler 522 may be coupled to the output end OUT3 of the radio frequency signal combination circuit 521, and the output end CPout of the coupler 522 may be coupled to the pad PD6.

Incidentally, in this embodiment, the load to which the coupler 522 is coupled may be disposed on the same second chip 520 or on another chip other than the second chip 520 without specific limitations. The coupler 522 further has an isolation end CPisl and a coupling end CPL.

On the other hand, the pad PD6 may be coupled to the pad PD7 of the third chip 530 through the conductive wire W3 to perform signal transmission and reception. The third chip 530 may include, for example, switching circuitry coupled to the antenna.

Figure 6A:
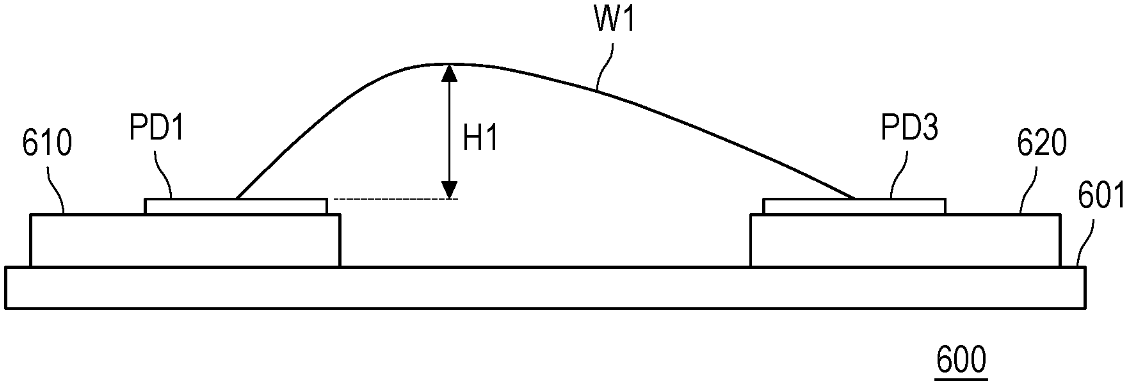
FIG. 6A and FIG. 6B are schematic diagrams of the adjustment method for the lengths of the first and second conductive wires on the semiconductor device of the embodiment of the disclosure.
Figure 6B:
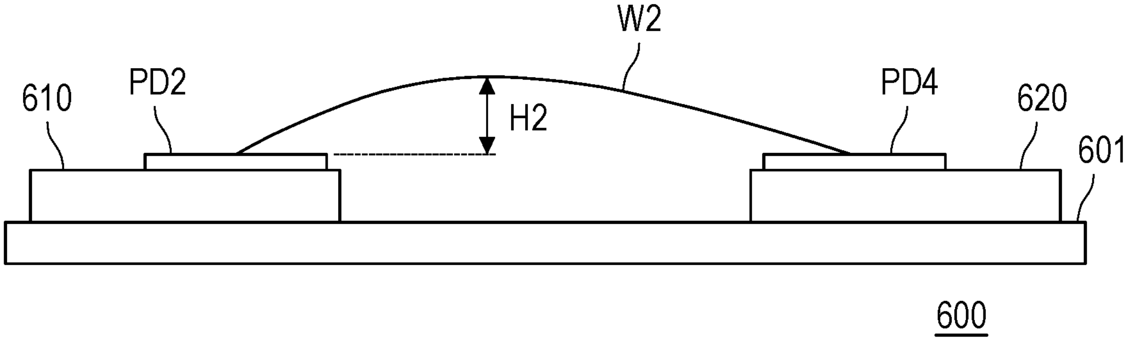

Referring to FIG. 6A and FIG. 6B, FIG. 6A and FIG. 6B are schematic diagrams of the adjustment method for the lengths of the first and second conductive wires on the semiconductor device of the embodiment of the disclosure. FIG. 6A and FIG. 6B both show cross-sectional schematic diagrams of the semiconductor device 600. In FIG. 6A, a semiconductor device 600 has a substrate 601. The first chip 610 and the second chip 620 in the semiconductor device 600 are both disposed on the substrate 601. In FIG. 6A, the first chip 610 has a pad PD1, and the second chip 620 has a pad PD3. The first conductive wire W1 is a bonding wire and is connected between the pad PD1 and the pad PD3. The first conductive wire W1 is connected in an arc shape between the pad PD1 and the pad PD3, and may have a maximum height H1 between its highest point and the pad PD1.

In addition, in FIG. 6B, the first chip 610 has a pad PD2, and the second chip 620 has a pad PD4. The second conductive wire W2 is a bonding wire and is connected between the pad PD2 and the pad PD4. The second conductive wire W2 is also connected in an arc shape between the pad PD2 and the pad PD4, and may have a maximum height H2 between its highest point and the pad PD2.

In this embodiment, by adjusting at least one of the maximum height H1 of the first conductive wire W1 and the maximum height H2 of the second conductive wire W2, the length of the first conductive wire W1 may be different from the length of the second conductive wire W2. For example, when the linear distance between the pad PD1 and the pad PD3 is the same as the linear distance between the pad PD2 and the pad PD4, the maximum height H1 of the first conductive wire W1 may be greater than the maximum height H2 of the second conductive wire W2, such that the length of the first conductive wire W1 is longer than the length of the second conductive wire W2. In the embodiment of the disclosure, in order to provide a better wideband matching inductance value, the difference between the maximum height H1 of the first conductive wire W1 and the maximum height H2 of the second conductive wire W2 may be, for example, within 1 mil. For example, the maximum height H1 of the first conductive wire W1 may be 7 mils, and the maximum height H2 of the second conductive wire W2 may be 6 mils.

To sum up, in the disclosure, by having first and second conductive wires, which couple the output end of the amplify unit to the input end of the radio frequency signal combination circuit, with different lengths, the amplify device may provide better matching for the amplify unit in wideband applications, and effectively enhance the operational efficiency of the amplify device.

What is claimed is:

1. An amplify device, comprising:
an amplify unit, having an input end and an output end;
a radio frequency signal combination circuit, having a first input end, a second input end, and an output end;
a first conductive wire, coupled between the output end of the amplify unit and the first input end of the radio frequency signal combination circuit; and
a second conductive wire, coupled between the output end of the amplify unit and the second input end of the radio frequency signal combination circuit,
wherein a length of the first conductive wire is different from a length of the second conductive wire,
wherein the first conductive wire and the second conductive wire are bonding wires.

2. The amplify device according to claim 1, wherein the first conductive wire and the second conductive wire have a same wire diameter.

3. The amplify device according to claim 1, further comprising: a coupler having an input end coupled to the output end of the radio frequency signal combination circuit.

4. The amplify device according to claim 1, wherein the output end of the amplify unit is respectively coupled to a first pad and a second pad, the first input end and the second input end of the radio frequency signal combination circuit are respectively coupled to a third pad and a fourth pad,
wherein a first end of the first conductive wire is connected to the first pad, a second end of the first conductive wire is connected to the third pad, a first end of the second conductive wire is connected to the second pad, and a second end of the second conductive wire is connected to the fourth pad.

5. The amplify device according to claim 4, wherein a first trace having a first trace length is coupled between the output end of the amplify unit and the first pad, a second trace having a second trace length is coupled between the output end of the amplify unit and the second pad, and the first trace length is equal to the second trace length.

6. The amplify device according to claim 4, wherein a first trace having a first trace length is coupled between the output end of the amplify unit and the first pad, a second trace having a second trace length is coupled between the output end of the amplify unit and the second pad, and a sum of the first trace length and a length of the first conductive wire is greater than a sum of the second trace length and a length of the second conductive wire.

7. The amplify device according to claim 1, wherein the radio frequency signal combination circuit comprises:
a first capacitor, coupled between the first input end of the radio frequency signal combination circuit and a first reference voltage end; and
a second capacitor, coupled between the second input end of the radio frequency signal combination circuit and a second reference voltage end.

8. The amplify device according to claim 7, wherein the radio frequency signal combination circuit further comprises:
a third capacitor, coupled between the first input end of the radio frequency signal combination circuit and the output end of the radio frequency signal combination circuit; and
a fourth capacitor, coupled between the second input end of the radio frequency signal combination circuit and the output end of the radio frequency signal combination circuit.

9. The amplify device according to claim 7, wherein the first conductive wire and the first capacitor form a first impedance at a radio frequency signal frequency, the second conductive wire and the second capacitor form a second impedance at the radio frequency signal frequency, and the first impedance is different from the second impedance.

10. The amplify device according to claim 7, wherein the first capacitor and the second capacitor have a same capacitance value.

11. The amplify device according to claim 4, wherein the amplify unit, the first pad, and the second pad are disposed on a first chip, and the radio frequency signal combination circuit, the third pad, and the fourth pad are disposed on a second chip.

12. The amplify device according to claim 1, wherein a length of the first conductive wire is N times a length of the second conductive wire, and N is between 1.4 and 1.7.

13. A semiconductor device, comprising:
a first chip, having an amplify unit, wherein the amplify unit has an input end and an output end;
a second chip, having a radio frequency signal combination circuit, wherein the radio frequency signal combination circuit has a first input end, a second input end, and an output end, the first input end is coupled to the second input end;

a first conductive wire, having a first end coupled to the output end of the amplify unit, a second end of the first conductive wire coupling to the first input end of the radio frequency signal combination circuit; and a second conductive wire, having a first end coupled to the output end of the amplify unit, a second end of the second conductive wire coupling to the second input end of the radio frequency signal combination circuit, wherein a length of the first conductive wire is different from a length of the second conductive wire, wherein the first conductive wire and the second conductive wire are bonding wires.

14. The semiconductor device according to claim 13, wherein a length of the first conductive wire is N times a length of the second conductive wire, and N is between 1.4 and 1.7.

15. The semiconductor device according to claim 13, wherein the second chip further has a fifth pad, the fifth pad is coupled to the output end of the radio frequency signal combination circuit, the semiconductor device further comprises a third chip, and the fifth pad is coupled to the third chip through a third conductive wire.

16. The semiconductor device according to claim 13, wherein the first chip further comprises a first pad and a second pad, and the second chip further comprises a third pad and a fourth pad, wherein the output end of the amplify unit is respectively coupled to the first pad and the second pad, the first input end and the second input end of the radio frequency signal combination circuit are respectively coupled to the third pad and the fourth pad, the first end of the first conductive wire is coupled to the first pad, the second end of the first conductive wire is coupled to the third pad, the first end of the second conductive wire is coupled to the second pad, and the second end of the second conductive wire is coupled to the fourth pad.

17. The semiconductor device according to claim 16, wherein the first pad and the second pad are disposed along a first straight line, the third pad and the fourth pad are disposed along a second straight line, the first straight line and the second straight line are perpendicular to each other, parallel to each other, or have a non-zero included angle.

18. The semiconductor device according to claim 17, wherein the first chip and the second chip are both disposed on a substrate, a first maximum height between the first conductive wire and the first pad is different from a second maximum height between the second conductive wire and the second pad.

* * * * *